United States Patent
Chen et al.

(10) Patent No.: US 11,302,893 B2
(45) Date of Patent: Apr. 12, 2022

(54) FOLDABLE DISPLAY PANEL, METHOD OF MANUFACTURING THEREOF, AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Cheng Chen, Hubei (CN); Chao Dai, Hubei (CN)

(73) Assignee: WUHAN CHINA STAR OPTOELECTRONICS SEMICONDUCTOR DISPLAY TECHNOLOGY CO. LTD., Wuhan (CN)

( * ) Notice: Subject to any disclaimer, the term of this patent is extended or adjusted under 35 U.S.C. 154(b) by 28 days.

(21) Appl. No.: 16/642,191

(22) PCT Filed: Dec. 26, 2019

(86) PCT No.: PCT/CN2019/128535
§ 371 (c)(1),
(2) Date: Feb. 26, 2020

(87) PCT Pub. No.: WO2021/088233
PCT Pub. Date: May 14, 2021

(65) Prior Publication Data
US 2021/0159450 A1    May 27, 2021

(30) Foreign Application Priority Data
Nov. 6, 2019   (CN) .......................... 201911076871.0

(51) Int. Cl.
*H01L 51/52*   (2006.01)
*H01L 27/32*   (2006.01)
(Continued)

(52) U.S. Cl.
CPC ...... *H01L 51/5253* (2013.01); *H01L 27/3246* (2013.01); *H01L 51/0097* (2013.01); *H01L 51/56* (2013.01); *H01L 2227/323* (2013.01)

(58) Field of Classification Search
CPC ............. H01L 51/5253; H01L 27/3246; H01L 51/0097; H01L 51/56
(Continued)

(56) References Cited

U.S. PATENT DOCUMENTS

2015/0036299 A1*  2/2015  Namkung .......... H01L 51/5253
                                                    361/749
2016/0233248 A1*  8/2016  Kwak ................. H01L 27/1248
(Continued)

FOREIGN PATENT DOCUMENTS

CN    106653818 A    5/2017
CN    109065577 A    12/2018
(Continued)

OTHER PUBLICATIONS

English Machine Translation of CN106653818 (Year: 2017).*
English Machine Translation of CN109564986 (Year: 2019).*

*Primary Examiner* — Dzung Tran
(74) *Attorney, Agent, or Firm* — The Roy Gross Law Firm, LLC; Roy Gross

(57) ABSTRACT

The present invention provides a display panel, which comprises at least one region to be cut and a functional region; the cross-sectional structure of the display panel comprises a substrate including a first sub-portion corresponding to a position of the region to be cut; a blocking part arranged on the first sub-portion; and a packaging layer arranged on the blocking part, and the contact surface of the packaging layer and the blocking part is a concave-convex surface. The display panel can improve the packaging effect.

16 Claims, 6 Drawing Sheets

(51) Int. Cl.
*H01L 51/00* (2006.01)
*H01L 51/56* (2006.01)

(58) Field of Classification Search
USPC .......................................................... 257/40
See application file for complete search history.

(56) References Cited

U.S. PATENT DOCUMENTS

| 2017/0170206 A1* | 6/2017 | Lee .................... H01L 29/78633 |
| 2017/0288004 A1* | 10/2017 | Kim .................... H01L 51/0096 |
| 2018/0136527 A1* | 5/2018 | Park ......................... G09G 3/32 |
| 2019/0165076 A1 | 5/2019 | Lee et al. |
| 2020/0280021 A1 | 9/2020 | Li et al. |

FOREIGN PATENT DOCUMENTS

| CN | 109564986 A | 4/2019 |
| CN | 109616506 A | 4/2019 |
| CN | 109841656 A | 6/2019 |
| CN | 110071228 A | 7/2019 |
| KR | 20190060190 A | 6/2019 |

\* cited by examiner

FOLDABLE DISPLAY PANEL, METHOD OF MANUFACTURING THEREOF, AND DISPLAY DEVICE

BACKGROUND OF INVENTION

Field of Invention

The present invention relates to the field of display panels, and more particularly, to a foldable display panel, a method of manufacturing thereof, and a display device.

Description of Prior Art

Organic light emitting diode (OLED) display devices are more and more widely used due to their advantages of light weight, self-luminescence, wide viewing angles, low driving voltage, high luminous efficiency, low power consumption, and quick response times. In particular, flexible OLED display devices have characteristics of bendability and portability, and have become a main area of research and development in the field of display technology.

Bending performance is a key point that affects lifetime of flexible and foldable display panels. However, since flexible and foldable screens need to undergo a cutting process during manufacturing processes, cracks will be generated at an edge of a cutting line. During a dynamic bending process, the cracks easily extend to a peripheral circuit area, which affects bending life of products.

SUMMARY OF INVENTION

A folding display panel, a method of manufacturing thereof, and a display device are provided, so as to solve the problem that crack easily extends to the peripheral circuit area and affects bending life of products.

In order to solve the above technical problems, a technical solution is provided. A folding display panel comprises a flexible substrate, an inorganic insulating layer, an organic planarization layer, a pixel defining layer, and an inorganic packaging layer. The inorganic insulating layer is disposed on a side of the flexible substrate, and a driving circuit is disposed in the inorganic insulating layer. The organic planarization layer is disposed on a side of the inorganic insulating layer away from the flexible substrate. The pixel defining layer is disposed on a side of the organic planarization layer away from the flexible substrate. An organic light emitting unit electrically connected to the driving circuit is disposed in the pixel defining layer. The inorganic packaging layer comprises the organic light emitting unit, and encapsulates the organic light emitting unit. The inorganic insulating layer comprises a groove and an opening, the groove crosses the bending region and the non-bending region, the opening is formed in the groove of the bending region and faces a side of the driving circuit, the inorganic packaging layer is recessed in a direction away from the opening to form a recess facing the opening, the groove is provided with a first organic barrier, and the opening is provided with a second organic barrier.

In order to solve the above technical problems, a method of manufacturing a folding display panel comprises forming a flexible substrate; laying a driving circuit on the flexible substrate; laying an inorganic insulating layer connected to the driving circuit on the flexible substrate; defining a groove and an opening in the inorganic insulating layer, and the groove crosses the bending region and the non-bending region, the opening is formed in the groove of the bending region and faces a side of the driving circuit; forming an organic planarization layer on the inorganic insulating layer, and the organic planarization layer is filled into the groove to form a first organic barrier, and the organic planarization layer is filled into the groove to form a second organic barrier; laying an organic light emitting unit on the organic planarization layer, and the organic light emitting unit is electrically connected to the driving circuit; laying an inorganic packaging layer encapsulating the organic light emitting unit, and the inorganic packaging layer is recessed in a direction away from the opening to form a recess facing the opening; and laying a pixel defining layer connected to the inorganic insulating layer on the organic planarization layer.

In order to solve the above technical problems, a display device is provided. The display device comprises a casing and a folding display panel, and the folding display panel is disposed on the casing.

The foldable display panel includes a flexible substrate, an inorganic insulating layer, an organic planarization layer, and a pixel defining layer, which are stacked in order. A driving circuit is disposed in the inorganic insulating layer, and an organic light emitting unit is disposed in the pixel defining layer. The organic light emitting unit is electrically connected to the driving circuit through the organic planarization layer. The foldable display panel further includes an inorganic packaging layer. The inorganic packaging layer includes the organic light emitting unit and encapsulates the organic light emitting unit so as to prevent external water or oxygen from entering the organic light emitting unit. The inorganic insulating layer includes grooves and openings. The grooves cross a bending region and a non-bending region. The grooves are formed between the driving circuit and an edge of the display panel. The grooves are provided with a first organic barrier, so that when a crack occurring at the edge of the display panel extends from the edge of the display panel to the driving circuit, the first organic barrier prevents the crack from further extending. The openings are formed in the grooves of the bending region and face a side of the driving circuit. Also, the openings may be formed in the bending region, and the openings may cross the bending region and the non-bending region. The openings are provided with a second organic barrier, and the second organic barrier is used to strengthen bending resistance of the bending region so as to further prevent the crack from extending without occupying an area of the non-bending region. The inorganic packaging layer is recessed in a direction away from the openings to form a recess facing the openings. As a result, the second organic barrier is spaced from the inorganic packaging layer so as to prevent the inorganic packaging layer from being connected to the second organic barrier, as this will cause the inorganic packaging layer to become insecurely connected and easily fall off.

DETAILED DESCRIPTION OF PREFERRED EMBODIMENTS

The technical solutions in the embodiments of the present application will be clearly and completely described below. Obviously, the described embodiments are only a part of the embodiments of the present application, but not all the embodiments. Based on the embodiments in the present application, all other embodiments obtained by a skilled person in the art without creative efforts shall fall within the claimed scope of the present application.

Reference to "one embodiment" herein means that a particular feature, structure, or characteristic described in connection with the embodiment may be included in at least one embodiment of the present application. The appearances of this phrase in various places in the specification are not necessarily all referring to the same embodiment, nor are they independent or alternative embodiments that are mutually exclusive with other embodiments. It is clearly and implicitly understood by those skilled persons in the art that the embodiments described herein may be combined with other embodiments.

Figure 1:
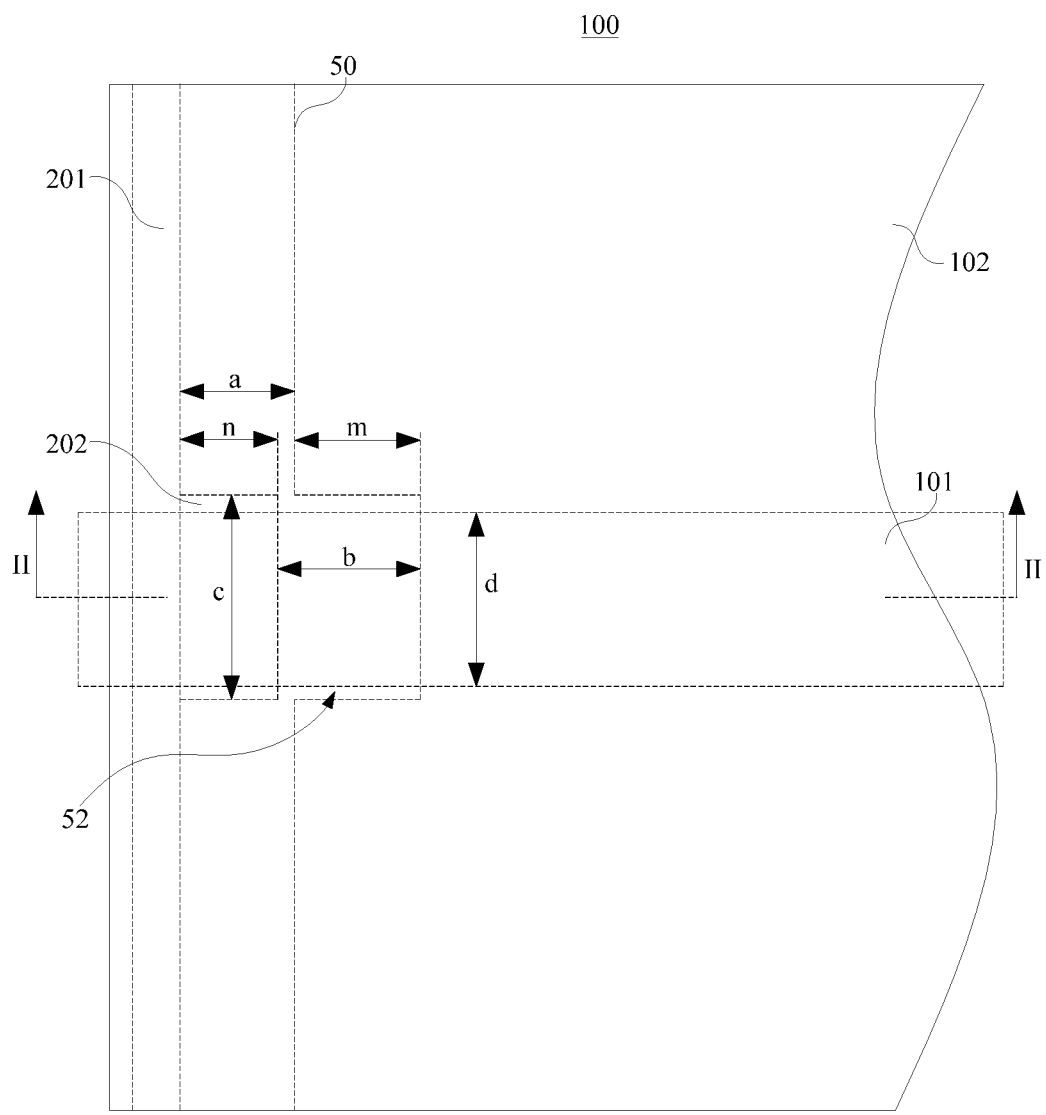
FIG. 1 is a schematic top view of a foldable display panel according to one embodiment of the present application.
Figure 2:
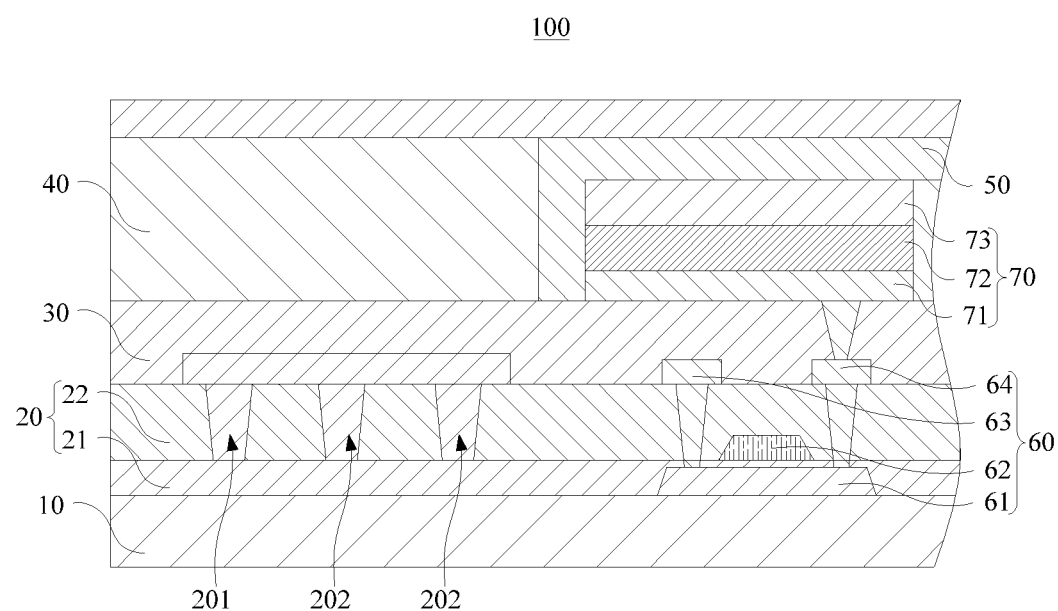
FIG. 2 is a schematic cross-sectional view taken along an II-II direction in FIG. 1 according to one embodiment of the present application.

Referring to FIG. 1 and FIG. 2, FIG. 1 is a schematic top view of a foldable display panel 100 according to one embodiment of the present application. FIG. 2 is a schematic cross-sectional view taken along an II-II direction in FIG. 1 according to one embodiment of the present application.

In one embodiment, the foldable display panel 100 includes a bending region 101 and a non-bending region 102. The bending region 101 in the foldable display panel 100 may be folded so as to freely switch between a flat state and a folded state. The bending region 101 and the non-bending region 102 may be used to display information such as pictures, texts, and videos.

The foldable display panel 100 includes a flexible substrate 10, an inorganic insulating layer 20, an organic planarization layer 30, a pixel defining layer 40, and an inorganic packaging layer 50.

Specifically, the flexible substrate 10, the inorganic insulating layer 20, the organic planarization layer 30, and the pixel defining layer 40 are sequentially stacked. A driving circuit 60 is disposed in the inorganic insulating layer 20, and an organic light emitting unit 70 is disposed in the pixel defining layer 40. The light emitting unit 70 is electrically connected to the driving circuit 60 through the organic planarization layer 30, and the inorganic packaging layer 50 includes the organic light emitting unit 70 and encapsulates the organic light emitting unit 70 so as to prevent external water or oxygen from entering the organic light emitting unit 70. The inorganic insulating layer 20 includes grooves and openings. The grooves cross the bending region 101 and the non-bending region 102. The grooves are formed between the driving circuit 60 and an edge of the display panel. The openings are defined in the grooves of the bending region 101 and face a side of the driving circuit 60. Also, the openings may be defined in the bending region 101, and the openings may cross the bending region 101 and the non-bending region 102. The inorganic packaging layer 50 is recessed in a direction away from the openings to form a recess 52 facing the openings, the grooves are provided with a first organic barrier 201, and the openings are provided with a second organic barrier 202.

The inorganic insulating layer 20 is made of an inorganic material, and the inorganic material may consist of $SiO_x$, $SiN_x$, SiON, $Al_2O_3$, etc.

The organic planarization layer 30 is made of an organic material, and the organic material may consist of any one of polyurethane, acrylic, or silicone rubber. Polyurethane, acrylic, and silicone rubber are elastic materials that can effectively absorb stress generated by folding the display panel, thereby preventing concentration of stress and improving bending reliability of the display panel.

The first organic barrier 201 is made of an organic material, and the second organic barrier 202 is made of an organic material. All materials of the first organic barrier 201, the second organic barrier 202, and the organic planarization layer 30 are the same. The organic planarization layer 30 is filled into the grooves to form the first organic barrier 201, and the organic planarization layer 30 is filled into the openings to form the second organic barrier 202.

In the embodiment, the foldable display panel 100 includes the flexible substrate 10, the inorganic insulating layer 20, the organic planarization layer 30, and the pixel defining layer 40, which are stacked in order. The driving circuit 60 is disposed in the inorganic insulating layer 20, and the organic light emitting unit 70 is disposed in the pixel defining layer 40. The light emitting unit 70 is electrically connected to the driving circuit 60 through the organic planarization layer 30. The foldable display panel 100 further includes the inorganic packaging layer 50. The inorganic packaging layer 50 includes the organic light emitting unit 70 and encapsulates the organic light emitting unit 70 so as to prevent external water or oxygen from entering the organic light emitting unit 70. The inorganic insulating layer 20 includes grooves and openings. The grooves cross the bending region 101 and the non-bending region 102. The grooves are formed between the driving circuit 60 and the edge of the display panel. The grooves are provided with the first organic barrier 201, so that when the crack occurring at the edge of the display panel extends from the edge of the display panel to the driving circuit 60, the first organic barrier 201 prevents the crack from further extending. The openings are formed in the grooves of the bending region 101 and face the side of the driving circuit 60. Also, the openings may be formed in the bending region 101, and the openings may cross the bending region 101 and the non-bending region 102. The openings are provided with the second organic barrier 202, and the second organic barrier 202 is used to strengthen the bending resistance of the bending region 101 so as to further prevent the crack from extending without occupying the area of the non-bending region 102. The inorganic packaging layer 50 is recessed in the direction away from the openings to form the recess 52 facing the openings. As a result, the second organic barrier 202 is spaced from the inorganic packaging layer 50 so as to prevent the inorganic packaging layer 50 from being connected to the second organic barrier 202, as this will cause the inorganic packaging layer 50 to become insecurely connected and easily fall off.

Figure 3:
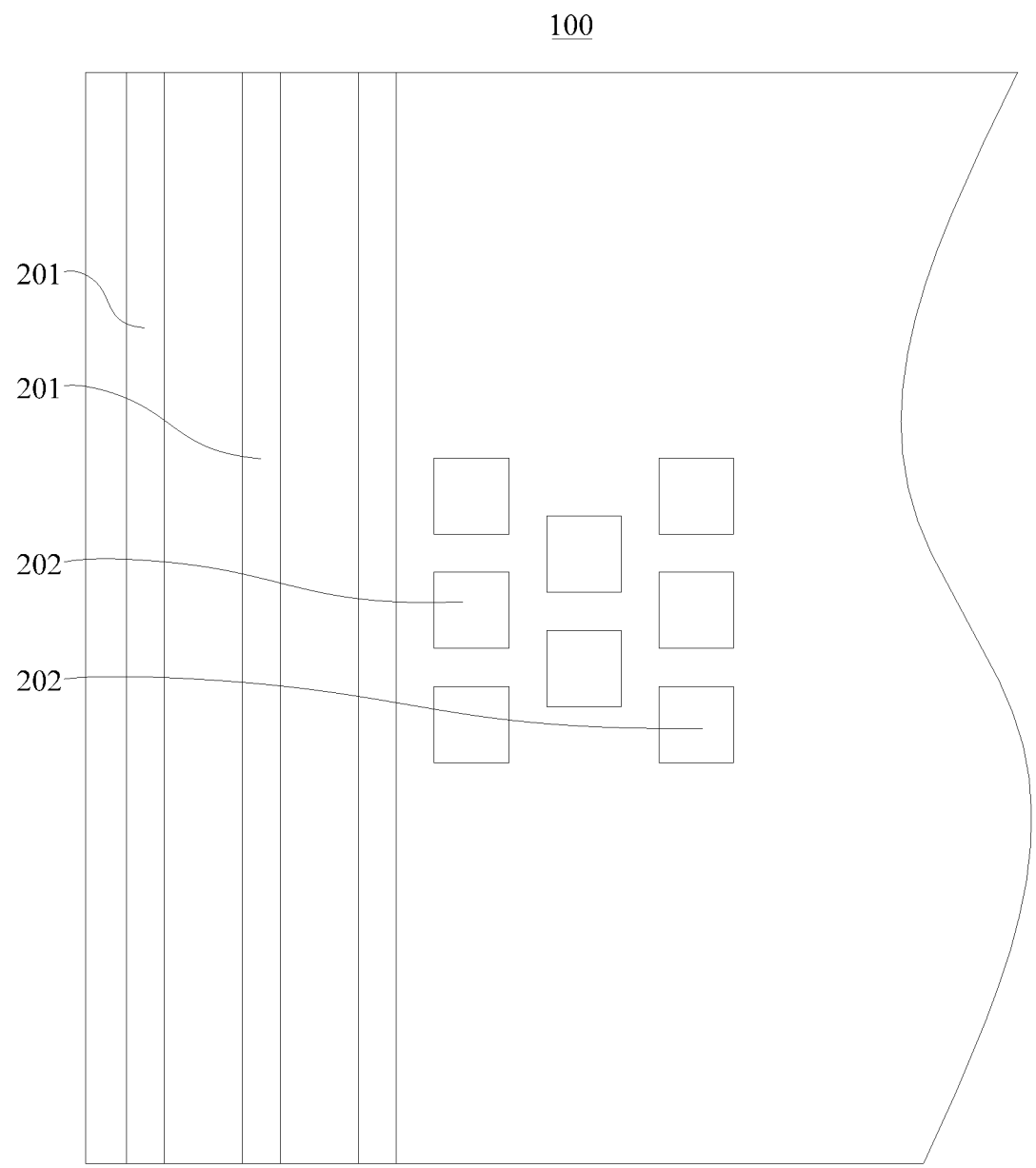
FIG. 3 is a schematic top view of the foldable display panel according to another embodiment of the present application.

Referring to FIG. 3, it is a schematic top view of the foldable display panel 100 according to another embodiment of the present application.

The number of grooves may be one. The number of grooves may also be multiple, such as two, three, four, etc. Multiple grooves may be parallel or substantially parallel to each other, and each groove is provided with a first organic barrier 201.

The number of openings may be one. The number of openings may also be multiple, such as two, three, four, etc. Multiple openings may be formed according to a predetermined setting, such as triangular, rectangular, regular polygonal, etc. Of course, multiple openings may also be formed randomly, and each opening is correspondingly provided with a second organic barrier 202.

The inorganic insulating layer 20 includes a gate insulating layer 21 and a passivation layer 22 that are stacked. The gate insulating layer 21 is connected to the flexible substrate 10, and grooves and openings are formed in the passivation layer 22. The driving circuit 60 includes an active layer 61, a gate electrode 62, a source 63, and a drain 64. The active layer 61 is disposed in the gate insulating layer 21, the gate electrode 62 is disposed in the passivation layer 22, the source 63 and the drain 64 are disposed in the organic planarization layer 30, and the source 63 and the drain 64 are connected to the active layer 61 through via holes in the passivation layer 22 and the gate insulating layer 21.

FIG. 1 is a plan view showing an orthographic projection of the flexible substrate 10.

A distance between the first organic barrier 201 and the inorganic packaging layer 50 is "a"; a distance between the second organic barrier 202 and a bottom of the recess 52 is "b"; a width of the second organic barrier 202 is "c"; a width of the bending region 101 is d; a depth of the recess 52 is "m"; and a length of the second organic barrier 202 is "n".

Generally, the first organic barrier 201 and the second organic barrier 202 are provided to prevent cracks from extending, but an upper layer of the crack prevention structure is an organic planarization layer. When a periphery of the product bending region is narrow, the inorganic packaging layer is easily evaporated onto the first organic barrier 201 and the second organic barrier 202. Due to poor adhesion between the inorganic packaging layer 50 and the organic layer, the inorganic packaging layer 50 is easily peeled off, affecting the packaging effect. Optionally, the distance "a" between the first organic barrier 201 and the inorganic packaging layer 50 is greater than the length "n" of the second organic barrier 202, so that the first organic barrier 201 and the inorganic packaging layer 50 are spaced apart, which prevents the inorganic packaging layer 50 from being connected to the first organic barrier 201, as this will cause the inorganic packaging layer 50 to become insecurely connected and easily fall off.

Optionally, the distance "a" between the first organic barrier 201 and the inorganic packaging layer 50 is less than or equal to the distance "b" between the second organic barrier 202 and the bottom of the recess 52. Therefore, a distance between the second organic barrier 202 and the inorganic packaging layer 50 is greater than or equal to a distance between the first organic barrier 201 and the inorganic packaging layer 50. This ensures that a distance between a crack passing through the second organic barrier 202 and reaching the inorganic packaging layer 50 is greater than or equal to a crack passing through the second organic barrier 202 reaching the inorganic packaging layer 50, thereby ensuring the reliability of the bending region 101.

Furthermore, the length "n" of the second organic barrier 202 is less than or equal to the depth "m" of the recess 52, so as to ensure that the second organic barrier 202 does not contact with the inorganic packaging layer 50 even if it is displaced into the recess 52.

Optionally, the width "c" of the second organic barrier 202 is greater than or equal to the width "d" of the bending region 101, so that the second organic barrier 202 covers the bending region 101.

There are multiple grooves, and they may be disposed side by side to provide multiple first organic barriers 201. There are also multiple openings, so that multiple second organic barriers 202 are disposed, and multiple openings may be formed side by side and spaced apart. Multiple openings may also be alternatively formed at intervals.

The first organic barrier 201 and the second organic barrier 202 may be connected to each other so as to increase the stability of the first organic barrier 201 and the second organic barrier 202.

The organic light emitting unit 70 includes an anode 71, a light emitting layer 72, and a cathode 73 that are stacked. The anode 71 is stacked on the organic planarization layer 30, and the anode 71 is electrically connected to the drain 64 of the driving circuit 60 through the organic planarization layer 30. The inorganic packaging layer 50 includes the anode 71, the light emitting layer 72, and the cathode 73.

Figure 4:
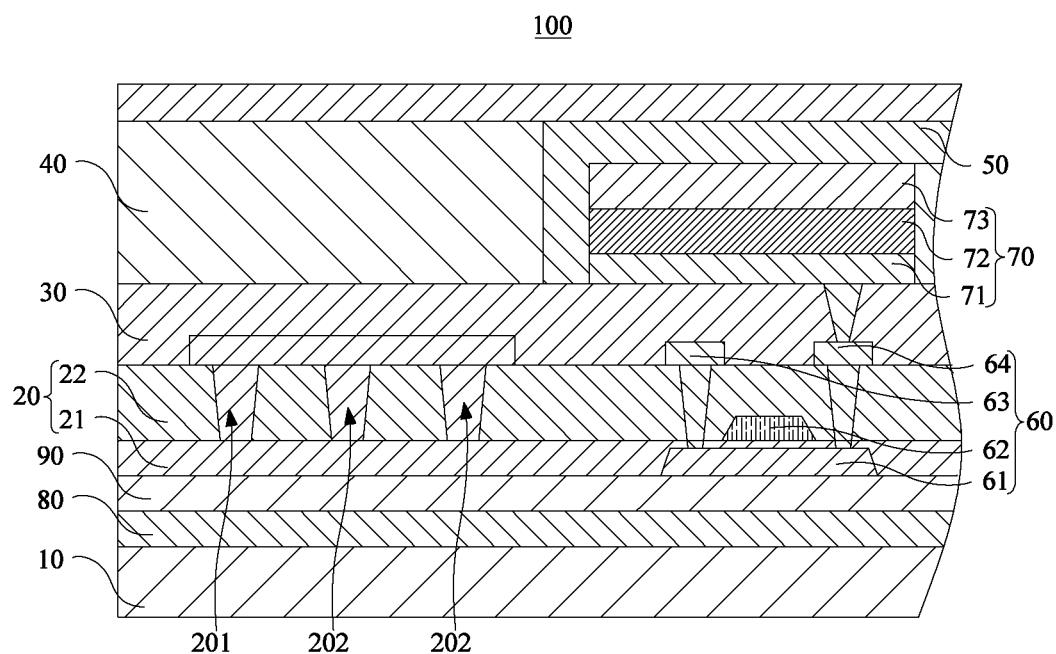
FIG. 4 is a schematic cross-sectional view of a foldable display panel according to another embodiment of the present application.

Referring to FIG. 4, it is a schematic cross-sectional view of a foldable display panel 100 according to another embodiment of the present application.

In the embodiment, the foldable display panel 100 further includes a water/oxygen blocking layer 80 and a buffer layer 90 that are stacked, the water/oxygen blocking layer 80 is connected to the flexible substrate 10, and the buffer layer 90 is connected to the inorganic insulating layer 20. The water/oxygen blocking layer 80 may prevent water and oxygen from entering the display panel from the flexible substrate 10, thereby preventing water and oxygen from corroding the organic light emitting unit 70. At the same time, the flexible substrate 10 is made of a flexible material, and the buffer layer 90 has flexibility to increase the flexibility of the display panel.

Figure 5:
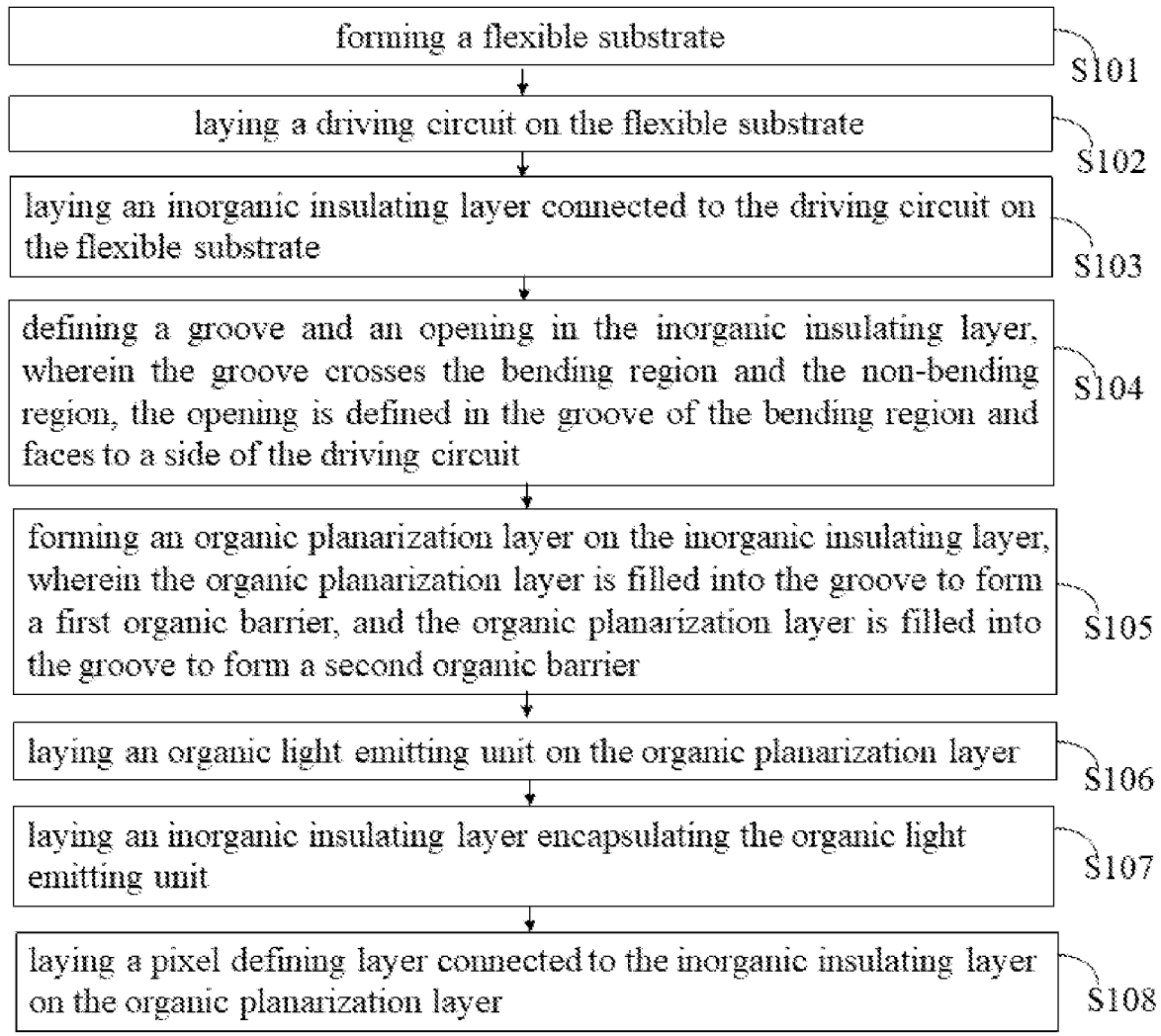
FIG. 5 is a schematic flowchart of a method of manufacturing a foldable display panel according to one embodiment of the present application.

Referring to FIG. 1 and FIG. 5, FIG. 5 is a schematic flowchart of a method of manufacturing the folding display panel 100 according to one embodiment of the present application.

Step S101: forming a flexible substrate 10.

A material of the flexible substrate 10 includes any one of polyacrylates, polyethylene terephthalate (PETS), fluorinated-polymers, polyethylene terephthalate (PEN), parylenes, polycarbonate (PC), etc. Then, the flexible substrate 10 is washed and dried.

Step S102: laying a driving circuit 60 on the flexible substrate 10.

A film is formed on the flexible substrate 10 by chemical vapor deposition or physical vapor deposition, and the driving circuit 60 is formed by exposure, development, and dry etching.

Step S103: laying an inorganic insulating layer 20 connected to the driving circuit 60 on the flexible substrate 10.

The inorganic insulating layer 20 includes a gate insulating layer 21 and a passivation layer 22 that are stacked. The gate insulating layer 21 is connected to the flexible substrate 10. The driving circuit 60 includes an active layer 61, a gate electrode 62, a source 63, and a drain 64. The active layer 61 is disposed in the gate insulating layer 21, the gate electrode 62 is disposed in the passivation layer 22, the source 63 and the drain 64 are disposed in the organic planarization layer 30, and the source 63 and the drain 64 are connected to the active layer 61 through via holes in the passivation layer 22 and the gate insulating layer 21.

Step S104, defining a groove and an opening in the inorganic insulating layer 20. The groove crosses the bending region 101 and the non-bending region 102, the groove is formed between the driving circuit 60 and an edge of the display panel, and the opening is formed in the groove of the bending region and faces a side of the driving circuit. The opening may be formed in the bending region 101, and the opening may also cross the bending region 101 and the non-bending region 102. The inorganic packaging layer 50 is recessed in a direction away from the opening to form the recess 52 facing the opening, the groove is provided with a first organic barrier 201, and the opening is provided with a second organic barrier 202.

The inorganic insulating layer 20 is made of an inorganic material, and the inorganic material may consist of $SiO_x$, $SiN_x$, SiON, $Al_2O_3$, etc.

Step S105: forming a planarization layer on the inorganic insulating layer 20. The planarization layer is filled into the groove to form the first organic barrier 201, and the planarization layer is filled into the opening to form the second organic barrier 202.

The organic planarization layer 30 is made of an organic material, and the organic material may consist of any one of polyurethane, acrylic, or silicone rubber. Polyurethane, acrylic, and silicone rubber are elastic materials that can effectively absorb stress generated by folding the display panel, thereby preventing concentration of stress and improving bending reliability of the display panel.

The first organic barrier 201 is made of an organic material, and the second organic barrier 202 is made of an organic material. All materials of the first organic barrier 201, the second organic barrier 202, and the organic planarization layer 30 are the same. The organic planarization layer 30 is filled into the groove to form the first organic barrier 201, and the organic planarization layer 30 is filled into the opening to form the second organic barrier 202.

Step S106: laying an organic light emitting unit 70 that is electrically connected to the driving circuit 60 on the planarization layer.

Laying the organic light emitting unit 70 that is electrically connected to the driving circuit 60 on the planarization layer. The organic light emitting unit 70 includes an anode 71, a light emitting layer 72, and a cathode 73 that are stacked. The anode 71 is stacked on the organic planarization layer 30. The anode 71 is electrically connected to the drain 64 of the driving circuit 60 through the organic planarization layer 30.

Step S107: laying an inorganic packaging layer 50 encapsulating the organic light emitting unit 70. The inorganic packaging aging layer 50 is recessed in a direction away from the opening to form the recess 52 facing the opening.

A packaging layer encapsulating the organic light emitting unit 70 is laid, and the inorganic encapsulation layer 50 encapsulates the anode 71, the light-emitting layer 72, and the cathode 73.

Step S108: laying a pixel defining layer 40 connected to the inorganic insulating layer on the organic planarization layer.

In the embodiment, the foldable display panel 100 includes a flexible substrate 10, an inorganic insulating layer 20, an organic planarization layer 30, and a pixel defining layer 40, which are stacked in order. The driving circuit 60 is disposed in the inorganic insulating layer 20, and the organic light emitting unit 70 is disposed in the pixel defining layer 40. The light emitting unit 70 is electrically connected to the driving circuit 60 through the organic planarization layer 30. The foldable display panel 100 further includes an inorganic packaging layer 50. The inorganic packaging layer 50 includes the organic light emitting unit 70 and encapsulates the organic light emitting unit 70 so as to prevent external water or oxygen from entering the organic light emitting unit 70. The inorganic insulating layer 20 includes grooves and openings. The grooves cross the bending region 101 and the non-bending region 102. The grooves are formed between the driving circuit 60 and an edge of the display panel. The grooves are provided with a first organic barrier 201, so that when a crack occurring at the edge of the display panel extends from the edge of the display panel to the driving circuit 60, the first organic barrier 201 prevents the crack from further extending. The openings are formed in the grooves of the bending region 101 and face a side of the driving circuit 60. Also, the openings may be formed in the bending region 101, and the openings may cross the bending region 101 and the non-bending region 102. The openings are provided with a second organic barrier 202, and the second organic barrier 202 is used to strengthen the bending resistance of the bending region 101, so as to further prevent the crack from extending without occupying the area of the non-bending region 102. The inorganic packaging layer 50 is recessed in a direction away from the openings to form the recess 52 facing the openings. As a result, the second organic barrier 202 is spaced from the inorganic packaging layer 50 so as to prevent the inorganic packaging layer 50 from being connected to the second organic barrier 202, as this will cause the inorganic packaging layer 50 to become insecurely connected and easily fall off.

Figure 6:
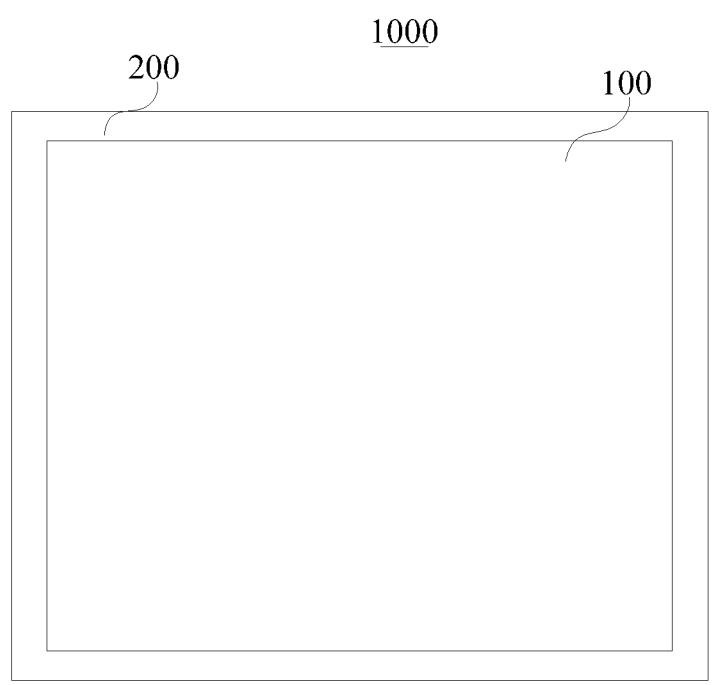
FIG. 6 is a schematic view of a display device according to one embodiment of the present application.

Referring to FIG. 6, it is a schematic view of a display device 1000 according to one embodiment of the present application.

The display device 1000 may include a casing 200 and the foldable display panel 100 according to any embodiment of the present application. The foldable display panel 100 is disposed on the casing 200. The display device 1000 may be a mobile phone, a computer, a television, a smart wearable device, etc.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A foldable display panel, comprising:
   a bending region;
   a non-bending region;
   a flexible substrate;
   an inorganic insulating layer disposed on a side of the flexible substrate, and a driving circuit disposed in the inorganic insulating layer;
   an organic planarization layer disposed on a side of the inorganic insulating layer away from the flexible substrate;
   a pixel defining layer disposed on a side of the organic planarization layer away from the flexible substrate, wherein an organic light emitting unit electrically connected to the driving circuit is disposed in the pixel defining layer; and
   an inorganic packaging layer covering the organic light emitting unit, wherein the inorganic insulating layer encapsulates the organic light emitting unit;
   wherein the inorganic insulating layer comprises a groove and an opening, the groove crosses the bending region and the non-bending region, the opening is formed in the groove of the bending region and faces a side of the driving circuit, the inorganic packaging layer is inwardly bent in a direction away from the opening to form a recess facing the opening, the groove is provided with a first organic barrier, the opening is provided with a second organic barrier, and the inorganic packaging layer does not contact the second organic barrier.

2. The foldable display panel according to claim 1, wherein on an orthographic projection of the flexible substrate, a distance between the first organic barrier and the inorganic insulating layer is greater than a length of the second organic barrier.

3. The foldable display panel according to claim 1, wherein on an orthographic projection of the flexible substrate, a distance between the first organic barrier and the inorganic insulating layer is less than or equal to a distance between the second organic barrier and a bottom of the recess.

4. The foldable display panel according to claim 3, wherein on an orthographic projection of the flexible substrate, a length of the second organic barrier is less than or equal to a depth of the recess.

5. The foldable display panel according to claim 1, wherein on an orthographic projection of the flexible substrate, a width of the second organic barrier is greater than or equal to a width of the bending region.

6. The foldable display panel according to claim 1, wherein the first organic barrier and the second organic barrier are connected to each other.

7. The foldable display panel according to claim 1, wherein the organic light emitting unit comprises an anode, a light emitting layer, and a cathode that are stacked, the anode is electrically connected to the driving circuit, and the inorganic insulating layer encapsulates the anode, the light emitting layer, and the cathode.

8. The foldable display panel according to claim 1, further comprising a water/oxygen blocking layer and a buffer layer which are stacked, wherein the water/oxygen blocking layer is connected to the flexible substrate, and the buffer layer is connected to the inorganic insulating layer.

9. A display device, comprising a casing and a foldable display panel, wherein the foldable display panel is disposed on the casing, and the foldable display panel comprises:
a bending region;
a non-bending region;
a flexible substrate;
an inorganic insulating layer disposed on a side of the flexible substrate, and a driving circuit disposed in the inorganic insulating layer;
an organic planarization layer disposed on a side of the inorganic insulating layer away from the flexible substrate;
a pixel defining layer disposed on a side of the organic planarization layer away from the flexible substrate, wherein an organic light emitting unit electrically connected to the driving circuit is disposed in the pixel defining layer; and
an inorganic insulating packaging layer covering the organic light emitting unit, wherein the inorganic insulating layer encapsulates the organic light emitting unit;
wherein the inorganic insulating layer comprises a groove and an opening, the groove crosses the bending region and the non-bending region, the opening is formed in the groove of the bending region and faces a side of the driving circuit, the inorganic packaging layer is inwardly bent in a direction away from the opening to form a recess facing the opening, the groove is provided with a first organic barrier, the opening is provided with a second organic barrier, and the inorganic packaging layer does not contact the second organic barrier.

10. The display device according to claim 9, wherein on an orthographic projection of the flexible substrate, a distance between the first organic barrier and the inorganic insulating layer is greater than a length of the second organic barrier.

11. The display device according to claim 9, wherein on an orthographic projection of the flexible substrate, a distance between the first organic barrier and the inorganic insulating layer is less than or equal to a distance between the second organic barrier and a bottom of the recess.

12. The display device according to claim 11, wherein on an orthographic projection of the flexible substrate, a length of the second organic barrier is less than or equal to a depth of the recess.

13. The display device according to claim 9, wherein on an orthographic projection of the flexible substrate, a width of the second organic barrier is greater than or equal to a width of the bending region.

14. The display device according to claim 9, wherein the first organic barrier and the second organic barrier are connected to each other.

15. The display device according to claim 9, wherein the organic light emitting unit comprises an anode, a light emitting layer, and a cathode that are stacked, the anode is electrically connected to the driving circuit, and the inorganic insulating layer encapsulates the anode, the light emitting layer, and the cathode.

16. The display device according to claim 9, further comprising a water/oxygen blocking layer and a buffer layer which are stacked, wherein the water/oxygen blocking layer is connected to the flexible substrate, and the buffer layer is connected to the inorganic insulating layer.

* * * * *